(12) United States Patent
Joo et al.

(10) Patent No.: US 8,119,546 B2
(45) Date of Patent: Feb. 21, 2012

(54) ARRAY SUBSTRATE, METHOD OF MANUFACTURING THE SAME AND METHOD OF CRYSTALLIZING SILICON

(75) Inventors: Soong-Yong Joo, Seongnam-si (KR); Myung-Koo Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 800 days.

(21) Appl. No.: 12/110,678

(22) Filed: Apr. 28, 2008

(65) Prior Publication Data

US 2008/0206912 A1  Aug. 28, 2008

Related U.S. Application Data

(62) Division of application No. 11/386,630, filed on Mar. 22, 2006, now Pat. No. 7,405,464.

(30) Foreign Application Priority Data

Jul. 29, 2005  (KR) .............................. 10-2005-69237

(51) Int. Cl.
*C30B 1/08* (2006.01)
*C30B 13/22* (2006.01)
*C30B 21/04* (2006.01)
(52) U.S. Cl. .............. 438/797; 438/487; 117/8; 117/10; 257/E21.134

(58) Field of Classification Search ................... None
See application file for complete search history.

(56) References Cited

U.S. PATENT DOCUMENTS

| 5,859,445 | A | * | 1/1999 | Yamazaki | ........................ 257/66 |
| 6,011,277 | A | | 1/2000 | Yamazaki | |
| 6,281,520 | B1 | | 8/2001 | Yamazaki | |
| 6,737,676 | B2 | | 5/2004 | Yamazaki | |
| 2002/0179001 | A1 | * | 12/2002 | Jung | ................................. 117/4 |
| 2004/0144988 | A1 | * | 7/2004 | Jung | ............................... 257/98 |
| 2006/0228908 | A1 | * | 10/2006 | Chung et al. | .................. 438/795 |

FOREIGN PATENT DOCUMENTS

| KR | 1020000001170 A | 1/2000 |
| KR | 1020040060502 A | 7/2004 |

* cited by examiner

*Primary Examiner* — Zandra Smith
*Assistant Examiner* — Pamela E Perkins
(74) *Attorney, Agent, or Firm* — Cantor Colburn LLP

(57) ABSTRACT

An array substrate includes a base substrate, a switching element, and a pixel electrode. The switching element is on the base substrate. The switching element includes a poly silicon pattern having at least one block. Grains are formed in each of the at least one block that are extended in a plurality of directions. The pixel electrode is electrically connected to the switching element. Therefore, current mobility and design margin of the switching element are improved.

10 Claims, 10 Drawing Sheets

ARRAY SUBSTRATE, METHOD OF MANUFACTURING THE SAME AND METHOD OF CRYSTALLIZING SILICON

This application is a divisional application of U.S. application Ser. No. 11/386,630 filed Mar. 22, 2006 which claims priority to Korean Patent Application No. 2005-69237, filed on Jul. 29, 2005 and all the benefits accruing therefrom under 35 U.S.C. §119, and the contents of which in its entirety are herein incorporated by reference.

BACKGROUND OF THE INVENTION

1. Field of the Invention

The present invention relates to an array substrate, a method of manufacturing the same, and a method of crystallizing silicon. More particularly, the present invention relates to an array substrate capable of improving current mobility and design margin of a switching element, a method of manufacturing the same, and a method of crystallizing silicon.

2. Description of the Related Art

A liquid crystal display ("LCD") device, in general, includes a display panel having an array substrate, a color filter substrate, and a liquid crystal layer. The array substrate includes a plurality of pixels arranged in a matrix, each including a thin film transistor ("TFT") and a pixel electrode. The color filter substrate includes a common electrode and corresponds to the array substrate. The liquid crystal layer is interposed between the array substrate and the color filter substrate. Liquid crystal molecules within the liquid crystal layer change orientations depending on the signals applied to the common electrode and the pixel electrodes, thereby changing an image on the display panel.

The LCD device is divided into an amorphous silicon ("a-Si") LCD device and a poly silicon LCD device. The a-Si LCD device includes an a-Si TFT. The poly silicon LCD device includes a poly silicon TFT.

In the poly silicon LCD device, the poly silicon TFT is formed through a crystallization of an amorphous silicon.

The amorphous silicon is crystallized through a sequential lateral solidification ("SLS") method. In particular, an irradiation of a laser beam is controlled using a mask that has a transmitting portion and a blocking portion. Size of a silicon grain is increased by a predetermined distance in a lateral direction to crystallize the amorphous silicon.

The transmitting portion and the blocking portion of the mask are extended in a longitudinal direction or a horizontal direction. Therefore, the poly silicon grain formed through the SLS method is extended in the horizontal direction or the longitudinal direction.

The current mobility of the poly silicon grain is increased in the extended direction of the poly silicon grain. That is, a channel direction of the TFT is substantially the same as the extended direction of the poly silicon grain.

Therefore, when the extended direction of the poly silicon grain is fixed, a location of the TFT is restricted, and a design margin of the TFT is deteriorated.

BRIEF SUMMARY OF THE INVENTION

The present invention provides an array substrate capable of improving current mobility and design margin of a switching element.

The present invention also provides a method of manufacturing the above-mentioned array substrate.

The present invention also provides a method of crystallizing silicon.

Exemplary embodiments of an array substrate in accordance with the present invention include a base substrate, a switching element, and a pixel electrode. The switching element is on the base substrate. The switching element includes a poly silicon pattern having at least one block. Grains formed in each block are extended in a plurality of directions. The pixel electrode is electrically connected to the switching element.

Exemplary embodiments of a method of manufacturing an array substrate in accordance with the present invention are provided as follows. A poly silicon pattern having at least one block is formed on a base substrate. Grains formed in each block are extended in a plurality of directions. A gate insulating layer is formed on the base substrate covering the poly silicon pattern. A gate electrode is formed on the gate insulating layer. The gate electrode overlaps the poly silicon pattern. An insulating interlayer covering the gate insulating layer and the gate electrode is formed. A first contact hole through which a first end portion of the poly silicon pattern is exposed and a second contact hole through which a second end portion of the poly silicon pattern is exposed in the insulating interlayer and the gate insulating layer is formed. A source electrode and a drain electrode are formed. The source and drain electrodes make contact with the first and second end portions through the first and second contact holes, respectively. A pixel electrode electrically connected to the drain electrode is formed.

Exemplary embodiments of a method of crystallizing silicon in accordance with the present invention are provided as follows. An amorphous silicon layer is formed on a base substrate. A mask is arranged on the amorphous silicon layer. The mask includes a transmitting portion having a substantially square shape and a blocking portion. A laser beam is irradiated on a first melting area of the amorphous silicon layer corresponding to the transmitting portion to melt the first melting area so that a poly silicon grain grows from an interface between the first melting area and a non-melting area toward an interior of the first melting area, where the non-melting area corresponds to the blocking portion. The mask is shifted by a width of the transmitting portion. The laser beam is irradiated on a second melting area of the amorphous silicon layer corresponding to the transmitting portion to melt the second melting area so that a poly silicon grain grows from an interface between the first and second melting areas towards an interior of the second melting area to form a poly silicon layer.

Exemplary embodiments of a poly silicon layer include a plurality of blocks, each block having a substantially square shape, four grain regions within each block, each grain region having a substantially triangular shape, wherein first and third grain regions include grains extended in a transverse direction of the poly silicon layer, and second and fourth grain regions include grains extended in a longitudinal direction of the poly silicon layer, wherein the transverse direction is substantially perpendicular to the longitudinal direction.

According to the present invention, the poly silicon layer includes the horizontally extended grains and the longitudinally extended grains to improve current mobility and design margin of the switching element.

BRIEF DESCRIPTION OF THE DRAWINGS

The above and other advantages of the present invention will become more apparent by describing in detail exemplary embodiments thereof with reference to the accompanying drawings, in which.

DETAILED DESCRIPTION OF THE INVENTION

Figure 1:
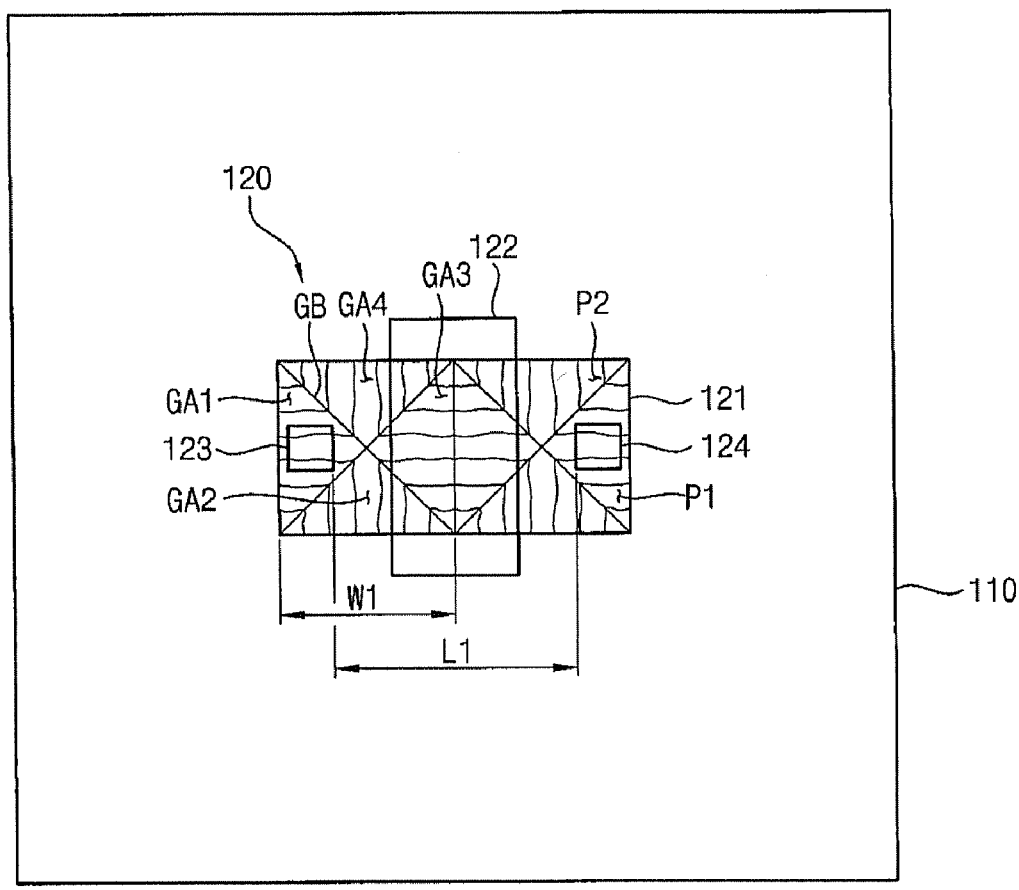
FIG. 1 is a plan view showing an exemplary embodiment of a switching element of an array substrate in accordance with the present invention.
Figure 1:
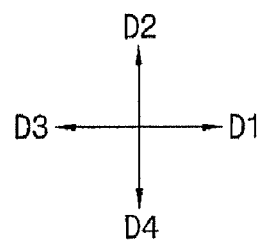

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a plan view showing an exemplary embodiment of a switching element of an array substrate in accordance with the present invention.

Referring to FIG. 1, the array substrate 100 includes a base substrate 110 and a poly silicon TFT 120 on the base substrate 110. Although only one poly silicon TFT 120 is illustrated in FIG. 1, it should be understood that a plurality of such poly silicon TFTs may be included on the base substrate 110.

The poly silicon TFT 120 includes a poly silicon pattern 121, a gate electrode 122, a source electrode 123, and a drain electrode 124. The poly silicon pattern 121 includes at least one block that is divided into a first grain region GA1, a second grain region GA2, a third grain region GA3, and a fourth grain region GA4. Each block of the poly silicon pattern 121 has a substantially square shape, and each of the first, second, third, and fourth grain regions GA1, GA2, GA3 and GA4 has a triangular shape. For example, the square shape of the block may be divided by two diagonal lines intersecting to create the four triangular shaped grain regions.

A plurality of first grains that are extended in a first direction D1 is formed in the first grain region GA1. A plurality of second grains that are extended in a second direction D2 is formed in the second grain region GA2. The second direction D2 is substantially perpendicular to the first direction D1. A plurality of third grains that are extended in a third direction D3 is formed in the third grain region GA3. The third direction D3 is substantially opposite to the first direction D1 and is substantially perpendicular to the second direction D2. A plurality of fourth grains that are extended in a fourth direction D4 is formed in the fourth grain region GA4. The fourth direction D4 is substantially opposite to the second direction D2 and is substantially perpendicular to the first direction D1 and the third direction D3.

That is, the first and third grains in the first and third grain regions GA1 and GA3 of the poly silicon pattern 121 grow in the horizontal or transverse direction of the array substrate 100. The second and fourth grains in the second and fourth grain regions GA2 and GA4 grow in the longitudinal direction of the array substrate 100. For example, the poly silicon pattern 121 may be more extended in the horizontal direction than the longitudinal direction.

Figure 5:
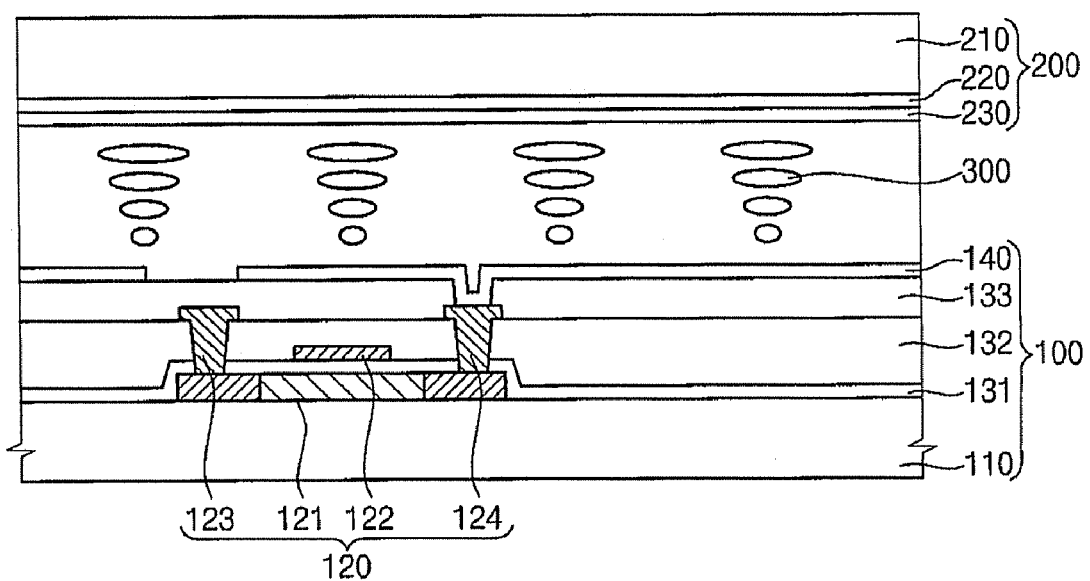
FIG. 5 is a cross-sectional view showing an exemplary embodiment of a display device in accordance with the present invention.

The gate electrode 122 overlaps the poly silicon pattern 121 when plan-viewed. A gate insulating layer (as shown in FIG. 5) is formed between the gate electrode 122 and the poly silicon pattern 121.

The source electrode 123 and the drain electrode 124 are on the poly silicon pattern 121. The source electrode 123 is spaced apart from the drain electrode 124 in the horizontal direction. The gate electrode 122 is positioned between the source electrode 123 and the drain electrode 124. The source and drain electrodes 123 and 124 make contact with opposite sides of the poly silicon pattern 121. A distance between the source and drain electrodes 123 and 124 is a channel width L1 of the poly silicon TFT 120, otherwise known as a switching element.

The channel width L1 is greater than a width W1 of each of the blocks of the poly silicon pattern 121. For example, the width W1 of each of the blocks is about 3 μm to about 4 μm.

In FIG. 1, the poly silicon pattern 121 is illustrated as extended in the horizontal direction. Alternatively, the poly silicon pattern 121 may be extended in the longitudinal direction, and the source electrode 123 may be spaced apart from the drain electrode 124 in the longitudinal direction.

According to the switching element 120 in FIG. 1, the poly silicon pattern 121 has the first and third grains in the first and third grain regions GA1 and GA3 that are extended in the horizontal direction and the second and fourth grains in the second and fourth grain regions GA2 and GA4 that are extended in the longitudinal direction so that the channel of the switching element 120 may be extended in either the longitudinal direction or the horizontal direction. Therefore, the design margin of the switching element 120 is improved.

In addition, the channel width L1 of the switching element 120 is greater than the width W1 of each of the blocks to improve the current mobility of the switching element 120.

FIGS. 2A to 2E are cross-sectional views showing an exemplary method of crystallizing amorphous silicon. FIG. 3A is a plan view showing a first exemplary poly silicon layer shown in FIG. 2C. FIG. 3B is a plan view showing a second exemplary poly silicon layer shown in FIG. 2E.

Figure 2A:
FIGS. 2A to 2E are cross-sectional views showing an exemplary method of crystallizing amorphous silicon.
Figure 3A:
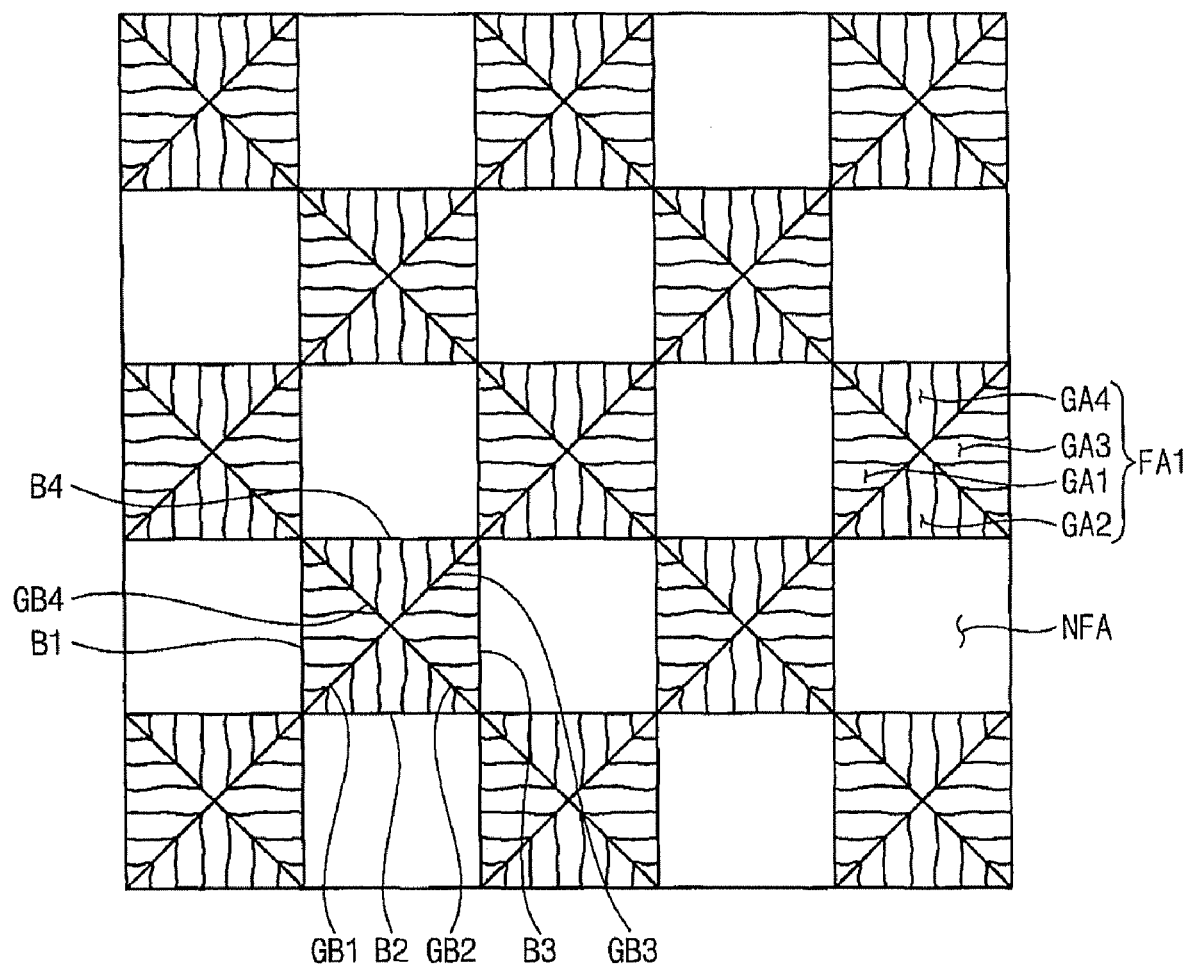
FIG. 3A is a plan view showing a first exemplary poly silicon layer shown in FIG. 2C.
Figure 3B:
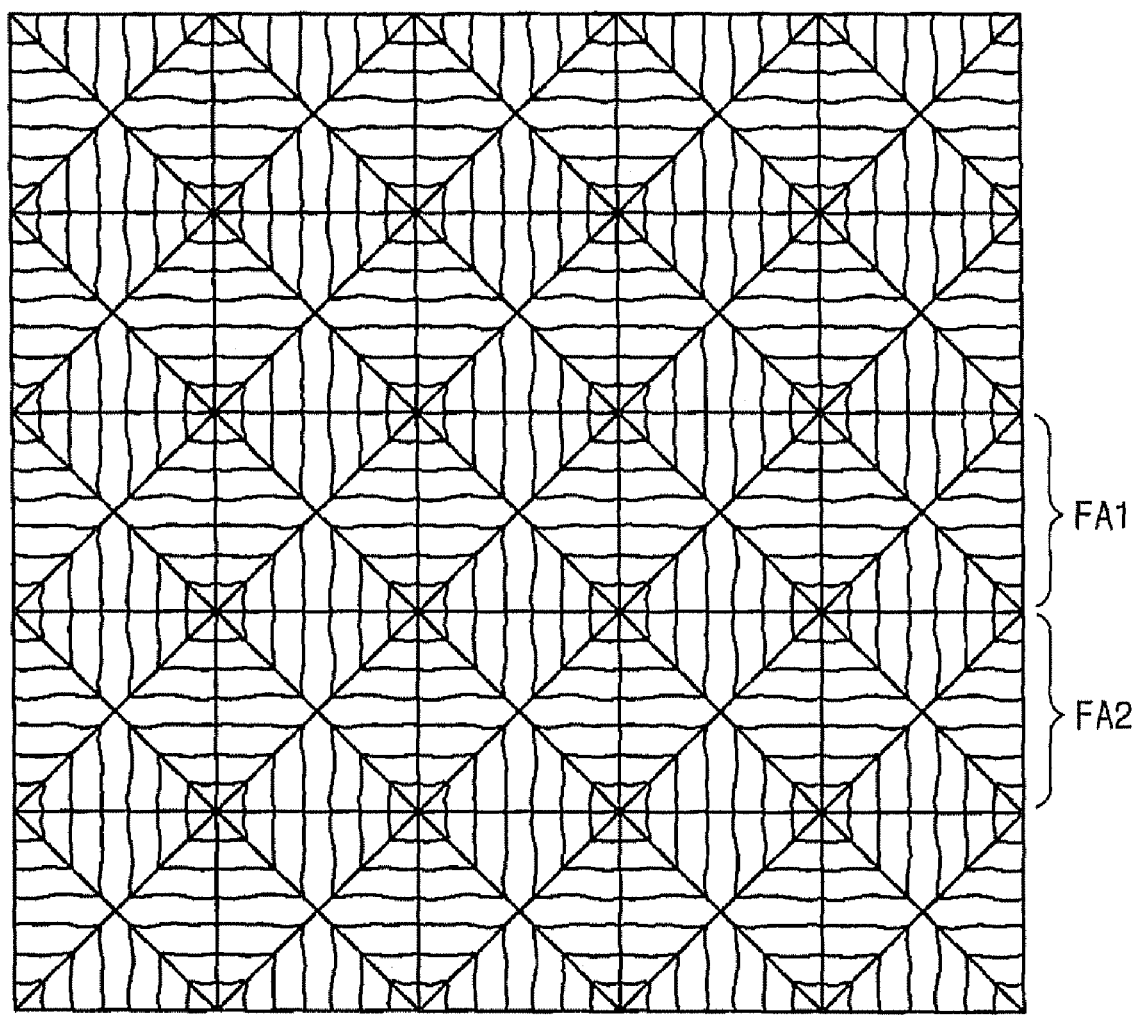
FIG. 3B is a plan view showing a second exemplary poly silicon layer shown in FIG. 2E.

Referring to FIG. 2A, an amorphous silicon ("a-Si") layer 111 is formed on the base substrate 110. The base substrate 110 may be an insulating substrate such as, but not limited to, transparent glass, quartz, etc.

Figure 2B:
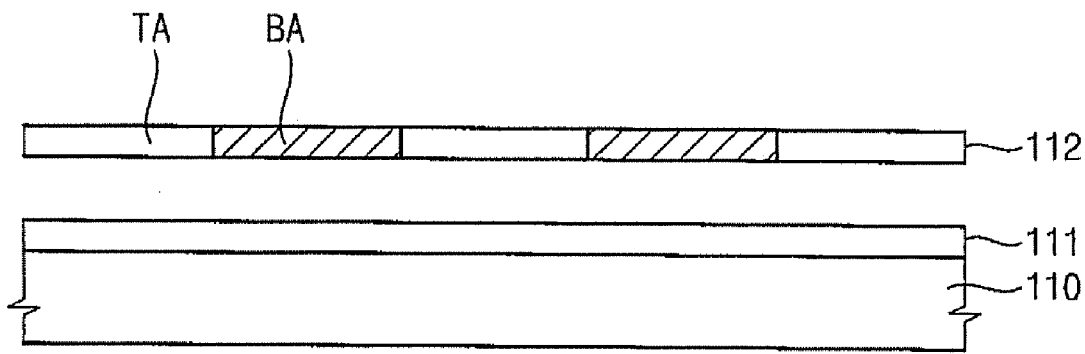

Referring to FIG. 2B, a mask 112 is arranged on the a-Si layer 111. The mask 112 includes a plurality of transmitting portions TA and a plurality of blocking portions BA. Light passes through the transmitting portions TA, and the blocking portions BA block the light from passing through. The transmitting portions TA and the blocking portions BA are alternately arranged in the first direction D1. The transmitting portions TA and the blocking portions BA are also alternately arranged in the second direction D2 (shown in FIG. 1) that is substantially perpendicular to the first direction D1 when plan-viewed. In other words, the transmitting portions TA and the blocking portions BA may be arranged in a checkerboard-like pattern within the mask 112.

Figure 2C:
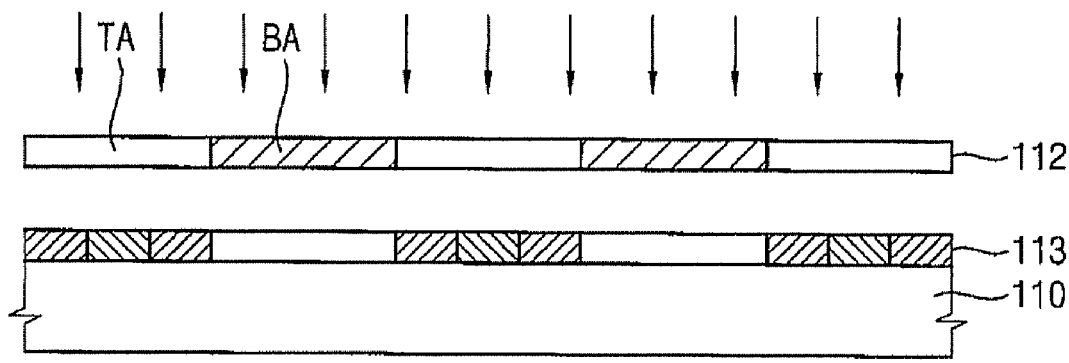

Referring to FIG. 2C, the laser beam, as indicated by the arrows, that passes through the transmitting portions TA of the mask 112 is irradiated onto the portions of the a-Si layer 111 corresponding to the transmitting portions TA so that the portions of the a-Si layer 111 corresponding to the transmitting portions TA are partially melted. The portions of the a-Si layer 111 corresponding to the blocking portions BA are blocked by the blocking portions BA.

Therefore, as shown in FIG. 3A, the a-Si layer 111 includes first melting areas FA1 corresponding to the transmitting portions TA and non-melting areas NFA corresponding to the blocking portions BA. Poly silicon grains grow from interfaces between each of the first melting areas FA1 and each of the non-melting areas NFA toward an interior of each of the first melting areas FA1. That is, the poly silicon grains grow within each first melting area FA1 in a direction generally perpendicularly from interfaces between each first melting area FA1 and any bordering non-melting area NFA.

Each of the first melting area FA1 and the non-melting area NFA has a square shape. The first melting area FA1 is divided into the first, second, third, and fourth grain regions GA1, GA2, GA3, and GA4, and the first, second, third, and fourth grain regions GA1, GA2, GA3, and GA4 have a substantially same size and triangular shape.

Within each first melting area FA1, the first grain region GA1 includes a plurality of first grains that are extended from a first interface B1 in the first direction D1, where the first interface B1 may be adjacent a non-melting area NFA on a first side of the first melting area FA1. The second grain region GA2 includes a plurality of second grains that are extended from a second interface B2 in the second direction D2, where the second interface B2 may be adjacent another non-melting area NFA on a second side of the first melting area FA1. The third grain region GA3 includes a plurality of third grains that are extended from a third interface B3 in the third direction D3, where the third interface B3 may be adjacent yet another non-melting area NFA on a third side of the first melting area FA1. The fourth grain region GA4 includes a plurality of fourth grains that are extended from a fourth interface B4 in the fourth direction D4, where the fourth interface B4 may be adjacent still yet another non-melting area NFA on a fourth side of the first melting area FA1.

A first grain boundary GB1 is formed between the first and second grain regions GA1 and GA2. A second grain boundary GB2 is formed between the second and third grain regions GA2 and GA3. A third grain boundary GB3 is formed between the third and fourth grain regions GA3 and GA4. A fourth grain boundary GB4 is formed between the fourth and first grain regions GA4 and GA1. The first through fourth grain boundaries generally define where the grains of each region abut with grains of an adjacent region.

Therefore, the a-Si layer 111 is transformed into a first poly silicon layer 113 that is partially crystallized and formed on the base substrate 110.

Figure 2D:
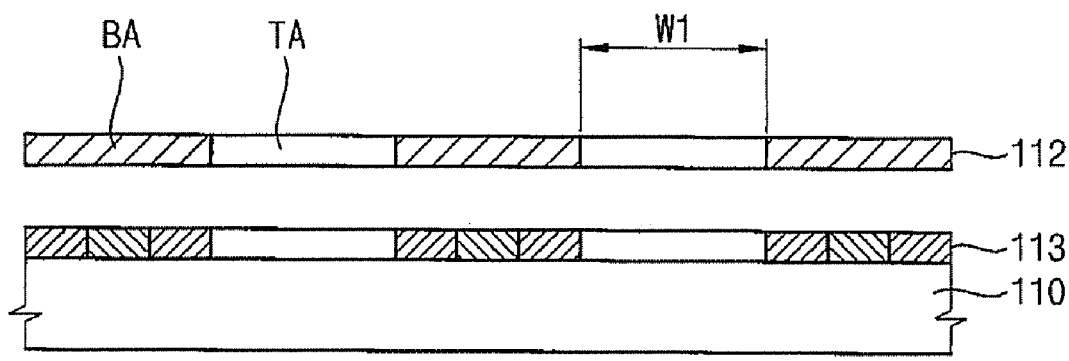

Referring to FIG. 2D, the mask 112 is shifted in the first direction D1 by the first width W1 of one transmitting portion TA so that the transmitting portions TA of the mask 112 correspond to the non-melting areas NFA of the first poly silicon layer 113, and the blocking portions BA correspond to the first melting areas FA1 of the first poly silicon layer 113.

Figure 2E:
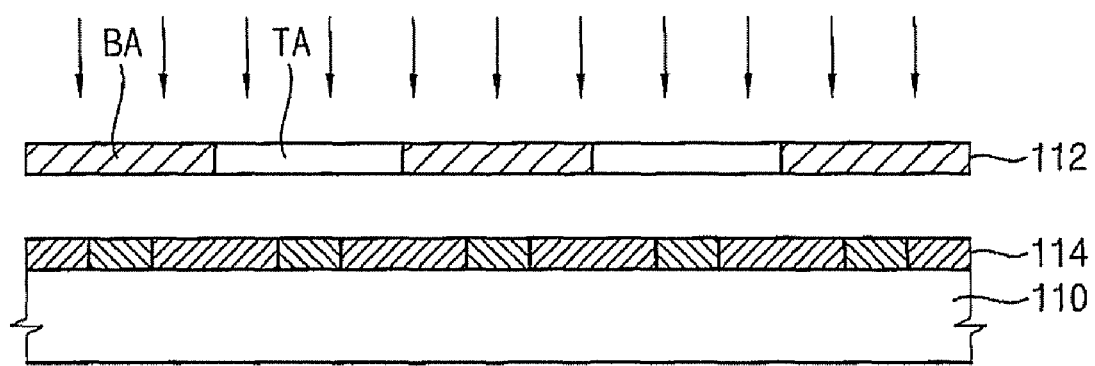

Referring to FIGS. 2E and 3B, the laser beam, indicated by the arrows, that passes through the transmitting portions TA of the mask 112 is irradiated onto the first poly silicon layer 113 corresponding to the non-melting areas NFA to melt the non-melting areas NFA, and the melted non-melting areas NFA then define second melting areas FA2. Poly silicon grains grow from an interface between the first melting areas FA1 and the second melting areas FA2 toward an interior of the second melting areas FA2. Therefore, the poly silicon grains having a substantially same shape and arrangement as the first melting areas FA1 are formed in the second melting areas FA2.

Therefore, the first poly silicon layer 113 is transformed into the second poly silicon layer 114 that is formed on the base substrate 110.

Referring to FIG. 3B, the second poly silicon layer 114 includes, within each block of the poly silicon pattern, the first and third grains that are extended in the horizontal direction and the second and fourth grains that are extended in the longitudinal direction. Therefore, the switching element 120 (shown in FIG. 1) may have the channels extended in either the longitudinal direction or the horizontal direction to improve the design margin of the switching element 120.

Hereinafter, an exemplary method of manufacturing the array substrate 100 is described in reference to FIGS. 4A to 4G.

FIGS. 4A to 4G are cross-sectional views showing an exemplary method of manufacturing the exemplary array substrate shown in FIG. 1.

Figure 4A:
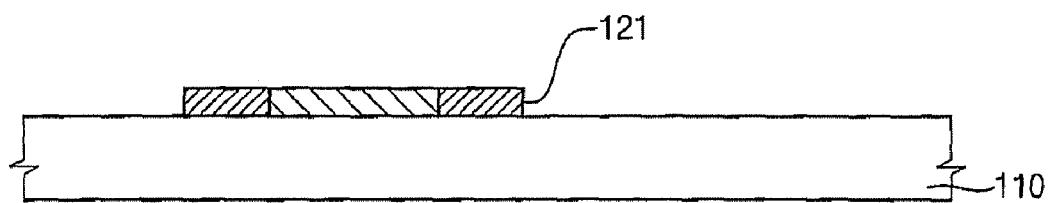
FIGS. 4A to 4G are cross-sectional views showing an exemplary method of manufacturing the exemplary array substrate shown in FIG. 1.

Referring to FIG. 4A, the second poly silicon layer 114 that is formed on the base substrate 110, such as by using the method described and illustrated with respect to FIGS. 2A to 2E, is patterned through a photolithography process. Photolithography is a process used to transfer a pattern from an optic mask to a layer of resist deposited on a surface. The optic mask blocks resist exposure to UV radiation in selected areas and may include chrome opaque areas supported by a plate transparent to UV radiation. Therefore, the poly silicon pattern 121 is formed on the base substrate 110.

Figure 4B:
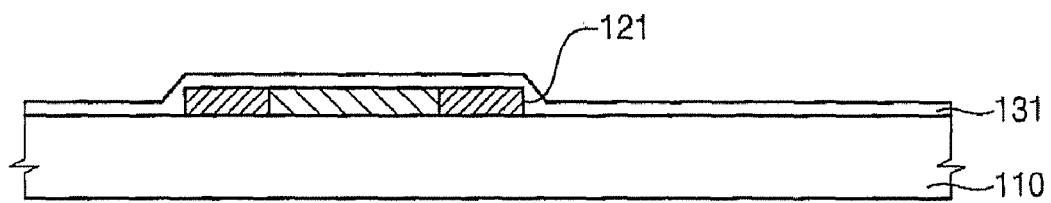

Referring to FIG. 4B, a gate insulating layer 131 is formed on the base substrate 110 having the poly silicon pattern 121. The gate insulating layer may cover both the base substrate 110 and the poly silicon pattern 121.

Figure 4C:
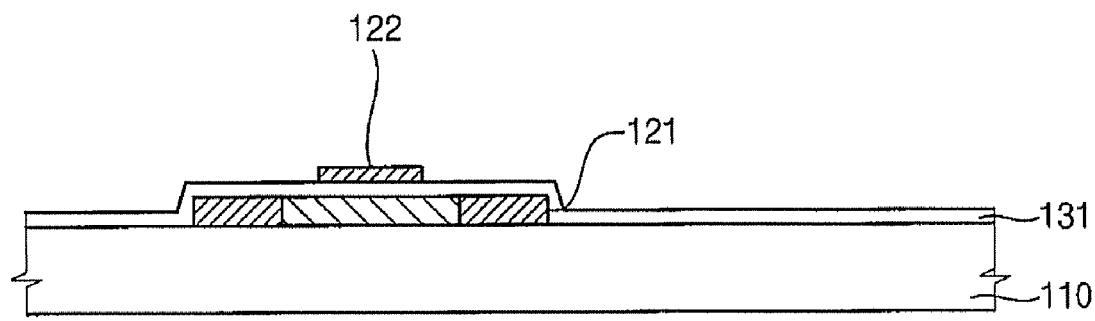

Referring to FIG. 4C, a first metal layer is deposited on the gate insulating layer 131, and the first metal layer is patterned to form the gate electrode 122. The gate electrode 122 overlaps the poly silicon pattern 121 when plan-viewed.

Figure 4D:
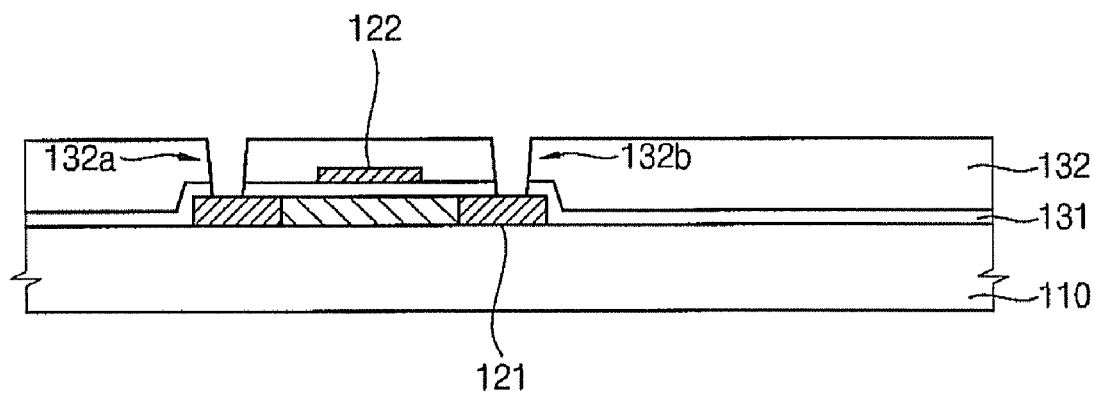

Referring to FIG. 4D, an insulating interlayer 132 is formed on the gate electrode 122 and the gate insulating layer 131. The insulating interlayer 132 and the gate insulating layer 131 are then patterned to form a first contact hole 132a and a second contact hole 132b both positioned over the poly silicon pattern 121. A first end portion and a second end portion of the poly silicon pattern 121 are exposed through the first and second contact holes 132a and 132b.

Figure 4E:
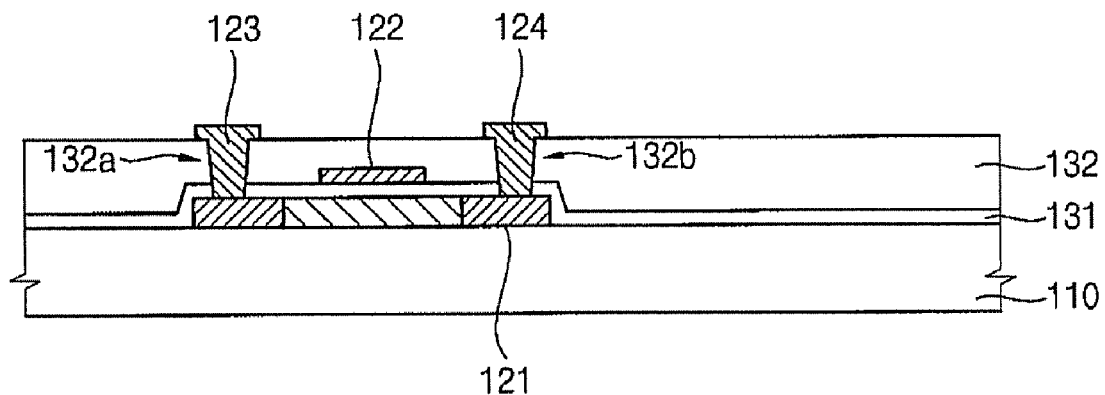

Referring to FIG. 4E, the source electrode 123 that makes contact with the first end portion of the poly silicon pattern 121 through the first contact hole 132a and the drain electrode 124 that makes contact with the second end portion of the poly silicon pattern 121 through the second contact hole 132b are then formed. Thus, the poly silicon TFT 120, as a switching element including the poly silicon layer 121, the gate electrode 122, the source electrode 123, and the drain electrode 124, is completed.

Figure 4F:
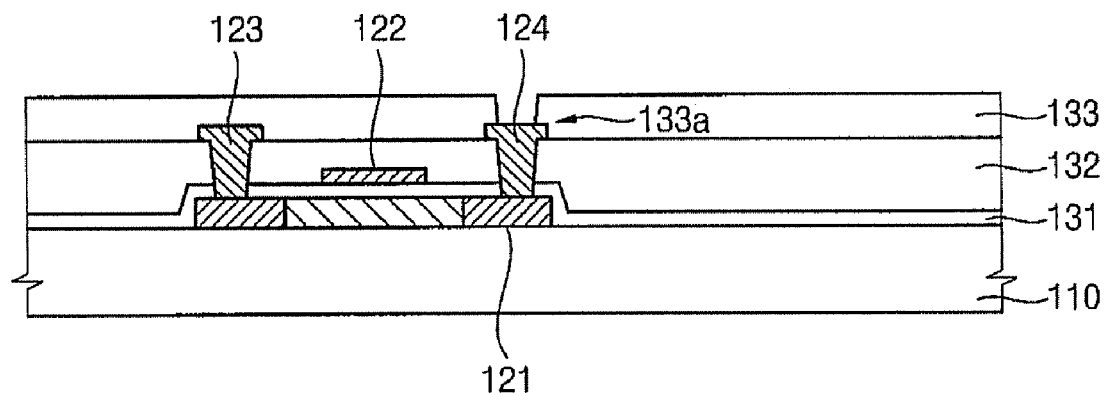

Referring to FIG. 4F, a protecting layer 133 is formed on the source electrode 123, the drain electrode 124, and the insulating interlayer 132. The protecting layer 133 is then patterned to form a third contact hole 133a through which the drain electrode 124 is partially exposed.

Figure 4G:
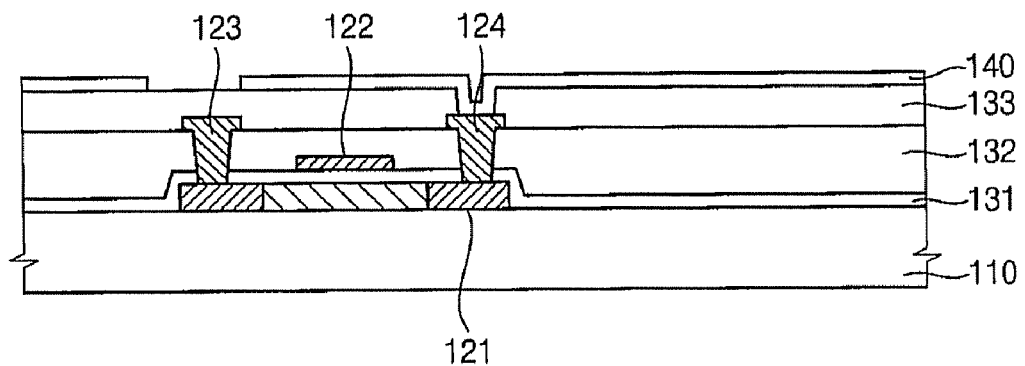

Referring to FIG. 4G, the pixel electrode 140 is formed on the protecting layer 133. The pixel electrode 140 is electrically connected to the drain electrode 124 through the third contact hole 133a. The pixel electrode 140 includes a transparent conductive material that may be patterned to form the pixel electrode 140. Examples of the transparent conductive material that can be used for the pixel electrode 140 include, but are not limited to, indium tin oxide ("ITO") and indium zinc oxide ("IZO"). Therefore, the array substrate 100 is completed, although other layers not specifically described herein may additionally be included in the array substrate 100. By example only, a polarized film may be provided on the array substrate 100 to adjust a transmission direction of light externally provided into the array substrate 100, in accordance with an aligned direction of the liquid crystal layer 300, as will be further described below with respect to FIG. 5.

FIG. 5 is a cross-sectional view showing an exemplary embodiment of a display device in accordance with the present invention. An array substrate shown in FIG. 5 is substantially the same as in FIGS. 1 through 2E. Thus, the same reference numerals will be used to refer to the same or like parts as those described in FIGS. 1 through 2E and any further explanation concerning the above elements will be omitted.

Referring to FIG. 5, the display device 400 includes a display panel. The display panel includes the array substrate 100, a counter substrate 200 corresponding to the array substrate 100, and a liquid crystal layer 300 interposed between the array substrate 100 and the counter substrate 200. The counter substrate 200 may otherwise be known as a common electrode panel or a color filter panel.

The counter substrate 200 includes a substrate 210, a color filter layer 220, and a common electrode 230. The color filter layer 220 is formed on the substrate 210, and the common electrode 230 is formed on the color filter layer 220. In an alternative embodiment, the color filter layer 220 may be formed on or under the pixel electrode 140 within the array substrate 100. The color filter layer 220 includes a red color pixel, a green color pixel, and a blue color pixel, although, in an alternative embodiment, other color pixels may be employed. The common electrode 230 includes a transparent conductive material. Examples of the transparent conductive material that can be used for the common electrode 230 include indium tin oxide ("ITO") and indium zinc oxide ("IZO"). The common electrode 230 may cover substantially an entire surface of the counter substrate 200.

Referring to FIG. 5, the counter substrate 200 corresponds to the array substrate 100 by a predetermined distance. The liquid crystal layer 300 is interposed in a space formed between the counter substrate 200 and the array substrate 100. The display panel of the display device 400 may include spacers to maintain the predetermined distance between the counter substrate 200 and the array substrate 100, and/or may include a sealing portion between a periphery of the array substrate 100 and the counter substrate 200 to maintain the liquid crystal layer 300 between the array substrate 100 and the counter substrate 200.

According to the present invention, the poly silicon layer includes the horizontally extended grains and the longitudinally extended grains. The horizontally extended grains and the longitudinally extended grains may be provided within blocks of grain regions alternately arranged across first and second directions of the poly silicon layer.

Therefore, the current mobility and design margin of the switching element are improved.

In addition, although the channel is arranged in the horizontal direction or the longitudinal direction allowing for greater design margin, the channel length of the switching element is longer than the width of each of the blocks of the poly silicon layer to also increase the current mobility of the switching element.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A method of manufacturing an array substrate comprising:
   forming a poly silicon pattern having at least one block on a base substrate, grains formed in each block extended in a plurality of directions;
   forming a gate insulating layer on the base substrate covering the poly silicon pattern;
   forming a gate electrode on the gate insulating layer, the gate electrode overlapping the poly silicon pattern;
   forming an insulating interlayer covering the gate insulating layer and the gate electrode;
   forming a first contact hole through which a first end portion of the poly silicon pattern is exposed and forming a second contact hole through which a second end portion of the poly silicon pattern is exposed in the insulating interlayer and the gate insulating layer;
   forming a source electrode and a drain electrode, the source and drain electrodes making contact with the first and second end portions through the first and second contact holes, respectively; and
   forming a pixel electrode electrically connected to the drain electrode,
   wherein each of the at least one block is divided into a first grain region, a second grain region, a third grain region, and a fourth grain region, and each of the first, second, third, and fourth grain regions has a substantially triangular shape.

2. The method of claim 1, wherein forming a poly silicon pattern includes
   forming an amorphous silicon layer on the base substrate;
   arranging a mask on the amorphous silicon layer, the mask including a transmitting portion and a blocking portion;
   irradiating a laser beam on a first melting area of the amorphous silicon layer corresponding to the transmitting portion to melt the first melting area;
   shifting the mask by a width of the transmitting portion; and
   irradiating the laser beam on a second melting area of the amorphous silicon layer corresponding to the transmitting portion to melt the second melting area and form a poly silicon layer.

3. The method of claim 2, wherein forming the poly silicon pattern further includes patterning the poly silicon layer through a photolithography process.

4. The method of claim 1, wherein each of the at least one block has a substantially square shape.

5. The method of claim 4, wherein grains formed in the first grain region and the third grain region are extended in a horizontal direction of the array substrate, and grains formed in the second and fourth grain regions that are adjacent to the first grain region are extended in a longitudinal direction of the array substrate.

6. The method of claim 1, wherein a width of each of the at least one block is no more than a distance between the source electrode and the drain electrode.

7. The method of claim 1, prior to the forming the pixel electrode, further comprising:
   forming a protecting layer on the insulating interlayer; and
   forming a third contact hole through which the drain electrode is partially exposed in the protecting layer,
   wherein forming the pixel electrode electrically connected to the drain electrode includes connecting the pixel electrode to the drain electrode through the third contact hole.

8. A method of crystallizing silicon comprising:
   forming an amorphous silicon layer on a base substrate;
   arranging a mask on the amorphous silicon layer, the mask including a transmitting portion having a substantially square shape and a blocking portion;
   irradiating a laser beam on a first melting area of the amorphous silicon layer corresponding to the transmitting portion to melt the first melting area so that a poly silicon grain grows from an interface between the first melting area and a non-melting area toward an interior of the first melting area, the non-melting area corresponding to the blocking portion;
   shifting the mask by a width of the transmitting portion; and
   irradiating the laser beam on a second melting area of the amorphous silicon layer corresponding to the transmitting portion to melt the second melting area so that a poly silicon grain grows from an interface between the first and second melting areas towards an interior of the second melting area to form a poly silicon layer,
   wherein each melting area is divided into a first grain region, a second grain region, a third grain region, and a fourth grain region, and each of the first, second, third, and fourth grain regions has a substantially triangular shape.

9. The method of claim 8, wherein a first grain extended in a first direction is formed in the first grain region,
   a second grain extended in a second direction that is substantially perpendicular to the first direction is formed in the second grain region,
   a third grain extended in a third direction that is substantially opposite to the first direction is formed in the third grain region, and
   a fourth grain extended in a fourth direction that is substantially opposite to the second direction is formed in the fourth grain region.

10. The method of claim 8, wherein the transmitting portion has substantially a same shape and size as a shape and size of the blocking portion.

* * * * *